(12) United States Patent
Kim et al.

(10) Patent No.: US 9,123,683 B2
(45) Date of Patent: Sep. 1, 2015

(54) UNIT POWER MODULE AND POWER MODULE PACKAGE COMPRISING THE SAME

(71) Applicant: SAMSUNG ELECTRO-MECHANICS CO., LTD., Suwon (KR)

(72) Inventors: Tae Hyun Kim, Suwon (KR); Bum Seok Suh, Suwon (KR); Do Jae Yoo, Suwon (KR); Kwang Soo Kim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/782,859

(22) Filed: Mar. 1, 2013

(65) Prior Publication Data

US 2014/0117408 A1    May 1, 2014

(30) Foreign Application Priority Data

Oct. 30, 2012 (KR) .................. 10-2012-0121287

(51) Int. Cl.
*H01L 23/00* (2006.01)

(52) U.S. Cl.
CPC .............. *H01L 24/34* (2013.01); *H01L 24/33* (2013.01); *H01L 2924/1305* (2013.01); *H01L 2924/13055* (2013.01); *H01L 2924/13091* (2013.01)

(58) Field of Classification Search
CPC ............... H01L 2924/00; H01L 2924/13055
USPC .......................................................... 257/678
See application file for complete search history.

(56) References Cited

U.S. PATENT DOCUMENTS

| | | | |
|---|---|---|---|
| 5,901,044 A * | 5/1999 | Marro | 361/728 |
| 5,920,119 A | 7/1999 | Tamba | |
| 6,697,257 B1 * | 2/2004 | Wolf et al. | 361/708 |
| 2007/0132073 A1 * | 6/2007 | Tiong et al. | 257/666 |
| 2008/0192437 A1 * | 8/2008 | Furuta | 361/715 |
| 2011/0254177 A1 * | 10/2011 | Malhan et al. | 257/782 |
| 2012/0211767 A1 * | 8/2012 | Kawanami et al. | 257/77 |

FOREIGN PATENT DOCUMENTS

| | | |
|---|---|---|
| JP | 1994-232303 | 8/1994 |
| JP | 2008-270527 | 11/2008 |
| KR | 2008-0008218 | 1/2008 |

OTHER PUBLICATIONS

Office action dated Oct. 15, 2013 from corresponding Korean Patent Application No. 10-2012-0121287 and its English summary provided by the clients.

* cited by examiner

*Primary Examiner* — Erik Kielin
(74) *Attorney, Agent, or Firm* — Ladas & Parry, LLP

(57) ABSTRACT

Disclosed herein is a unit power module including: a first semiconductor chip having one surface on which a 1-1-th electrode and a 1-2-th electrode spaced apart from the 1-1-th electrode are formed and the other surface on which a 1-3-th electrode is formed, a second semiconductor chip having one surface on which a 2-1-th electrode is formed and the other surface on which a 2-2-th electrode is formed, a first metal plate contacting the 1-1-th electrode of the first semiconductor chip and the 2-1-th electrode of the second semiconductor chip, a second metal plate contacting the 1-2-th electrode of the first semiconductor chip and spaced apart from the first metal plate, a third metal plate contacting the 1-3-th electrode of the first semiconductor chip and the 2-2-th electrode of the second semiconductor chip, and a sealing member formed to surround the first metal plate, the second metal plate, and the third metal plate.

14 Claims, 7 Drawing Sheets

UNIT POWER MODULE AND POWER MODULE PACKAGE COMPRISING THE SAME

CROSS REFERENCE TO RELATED APPLICATION

This application claims the benefit of Korean Patent Application No. 10-2012-0121287, filed on Oct. 30, 2012, entitled "Unit Power Module and Power Module Package Comprising the Same" which is hereby incorporated by reference in its entirety into this application.

BACKGROUND OF THE INVENTION

1. Technical Field

The present invention relates to a unit power module and a power module package comprising the same.

2. Description of the Related Art

Underground resources are limited but energy usage has increased every year. Therefore, all the countries are paying more attention and effort to the development of alternative energy.

This effort has continued to the development of technologies of implementing high efficiency with less energy. One of the technologies is the power module.

The power module may be largely classified into an inverter, a converter, a device for driving a motor. The power module has various types according to the purpose and the usage thereof has been continuously increased.

The industrial and high-capacity power modules having a case type according to the prior art cannot be mass-produced and are expensive, such that the power modules do not have easy accessibility.

When the power modules having the case form have a structure that can be mass-produced and a lighter and slimmer structure, the power modules can be used at low costs at more places, which may implement energy saving, protection of resources, and protection of nature.

To achieve the targets, a power module package structure can resolve the heat generation problem that is the largest vulnerability of the power module and can be mass-produced has first been developed.

Meanwhile, the structure of the power module package according to the prior art is disclosed in U.S. Pat. No. 5,920,119.

SUMMARY OF THE INVENTION

The present invention has been made in an effort to provide a unit power module capable of saving failure cost and being easily replaced at the time of the occurrence of defects and a power module package comprising the same.

Further, the present invention has been made in an effort to provide a unit power module with the simplified process and the improved unit per hour (UPH) and a power module package comprising the same.

In addition, the present invention has been made in an effort to provide a unit power module with the easy customize according to a request of a customer and a power module package comprising the same.

According to a preferred embodiment of the present invention, there is provided a unit power module, including: a first semiconductor chip having one surface on which a 1-1-th electrode and a 1-2-th electrode spaced apart from the 1-1-th electrode are formed and the other surface on which a 1-3-th electrode is formed; a second semiconductor chip having one surface on which a 2-1-th electrode is formed and the other surface on which a 2-2-th electrode is formed; a first metal plate contacting the 1-1-th electrode of the first semiconductor chip and the 2-1-th electrode of the second semiconductor chip; a second metal plate contacting the 1-2-th electrode of the first semiconductor chip and spaced apart from the first metal plate; a third metal plate contacting the 1-3-th electrode of the first semiconductor chip and the 2-2-th electrode of the second semiconductor chip; a sealing member formed to surround the first metal plate, the second metal plate, and the third metal plate.

The first semiconductor chip may be an insulated gate bipolar transistor (IGBT) and the 1-1-th electrode, the 1-2-th electrode, and the 1-3-th electrode may each be an emitter electrode, a gate electrode, and a collector electrode.

The second semiconductor chip may be a diode and the 2-1-th electrode and the 2-2-th electrode may each be an anode electrode and a cathode electrode.

The first metal plate, the second metal plate, and the third metal plate may be exposed to one of both sides of the unit power module in a thickness direction and the first metal plate and the third metal plate may be exposed to the other side thereof.

The first metal plate, the second metal plate, and the third metal plate exposed to both sides of the unit power module may each be an emitter pad, a gate pad, and a collector pad.

The unit power module may further include: an insulating layer formed on the first metal plate.

The unit power module may further include: an insulating layer formed on the third metal plate.

According to another preferred embodiment of the present invention, there is provided a power module package, including: a unit power module including a first semiconductor chip having one surface on which a 1-1-th electrode and a 1-2-th electrode spaced apart from the 1-1-th electrode are formed and the other surface on which a 1-3-th electrode is formed, a second semiconductor chip having one surface on which a 2-1-th electrode is formed and the other surface on which a 2-2-th electrode is formed, a first metal plate contacting the 1-1-th electrode of the first semiconductor chip and the 2-1-th electrode of the second semiconductor chip, a second metal plate contacting the 1-2-th electrode of the first semiconductor chip and spaced apart from the first metal plate, a third metal plate contacting the 1-3-th electrode of the first semiconductor chip and the 2-2-th electrode of the second semiconductor chip, and a sealing member formed to surround the first metal plate, the second metal plate, and the third metal plate; and a case in which at least one unit power module is received.

The first semiconductor chip may be an insulated gate bipolar transistor (IGBT) and the 1-1-th electrode, the 1-2-th electrode, and the 1-3-th electrode may each be an emitter electrode, a gate electrode, and a collector electrode.

The second semiconductor chip may be a diode and the 2-1-th electrode and the 2-2-th electrode may each be an anode electrode and a cathode electrode.

The first metal plate, the second metal plate, and the third metal plate may be exposed to one of both sides of the unit power module in a thickness direction and the first metal plate and the third metal plate may be exposed to the other side thereof, and the first metal plate, the second metal plate, and the third metal plate exposed to both sides of the unit power module may each be an emitter pad, a gate pad, and a collector pad.

The case may include: an insertion groove into which the unit power module is inserted; an external connection terminal including a power supply terminal, a ground terminal, a control terminal, and an output terminal formed to be exposed on a surface of the case; a circuit pattern formed in an inside of the case and having one end and the other end, the one end contacting the external connection terminal and the other end being formed toward an inner wall of the insertion groove; and a plurality of bonding members having ends and the other ends, the one end contacting the circuit pattern and the other end is protruded to an inside of the insertion groove to contact an emitter pad, a gate pad, and a collector pad of the unit power module, respectively.

The emitter pad, the gate pad, and the collector pad exposed to one side of the unit power module may each be electrically connected with a ground terminal, a control terminal, and a power supply terminal, and the emitter pad and the collector pad exposed to the other side of the unit power module may be electrically connected with the output terminal.

The connection member may be formed of a material having elastic force.

The plurality of unit power modules may be laminated and received in the case.

The power module package may further include: a heat sink contacting a top portion, a bottom portion or the top and bottom portions of the case.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention are described in detail with reference to the accompanying drawings.

Unit Power Module

Figure 1:
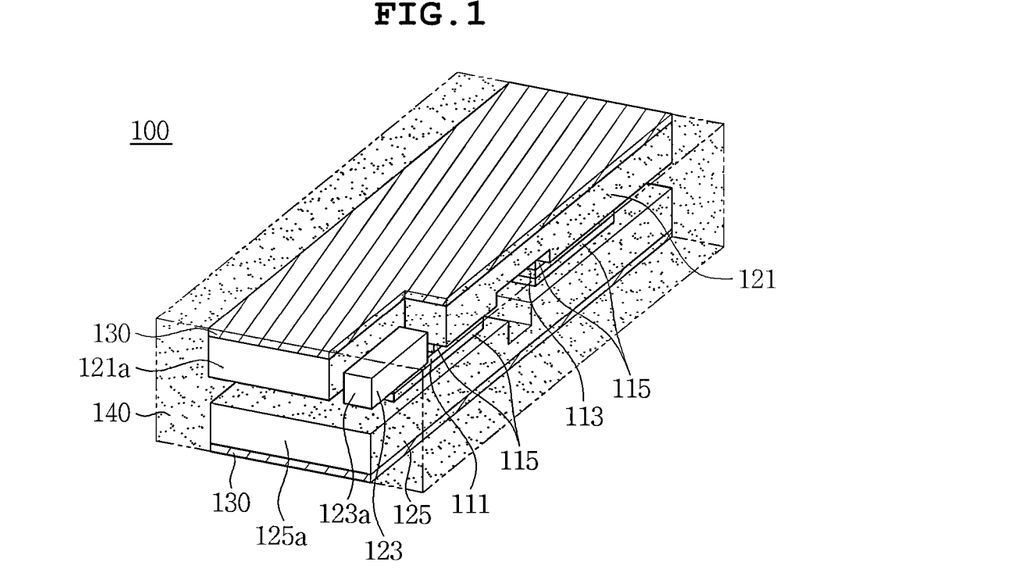
FIG. 1 is a perspective view illustrating a structure of a unit power module according to a preferred embodiment of the present invention.
Figure 2:
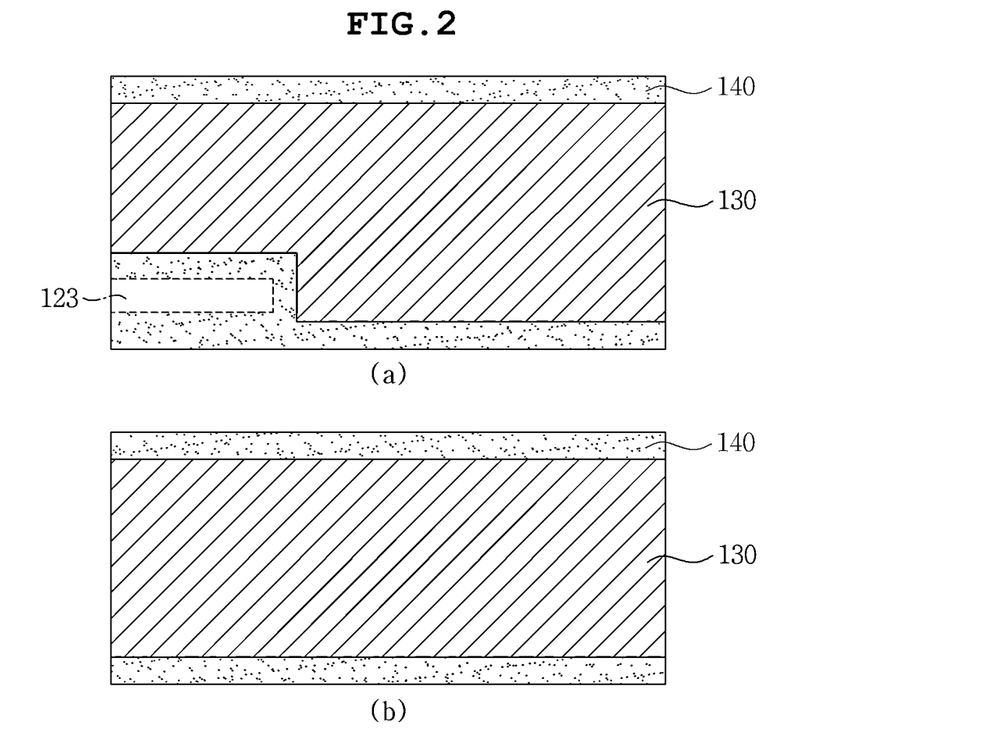
FIGS. 2A and 2B are plan views illustrating top and bottom surfaces of the unit power module according to the preferred embodiment of the present invention.
Figure 3:
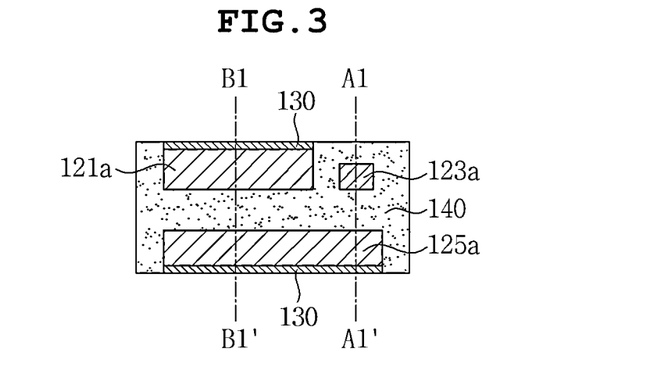
FIGS. 3 and 4 each illustrate one side view and the other side view of the unit power module according to the preferred embodiment of the present invention.
Figure 4:
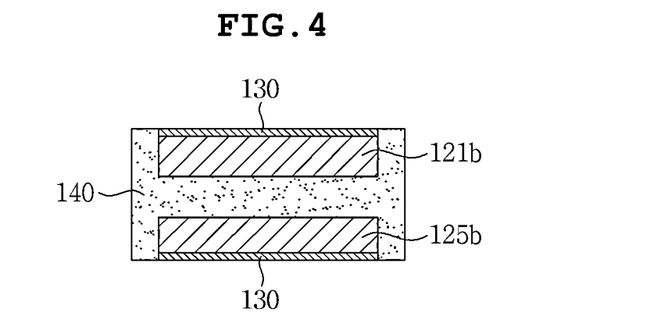
Figure 5:
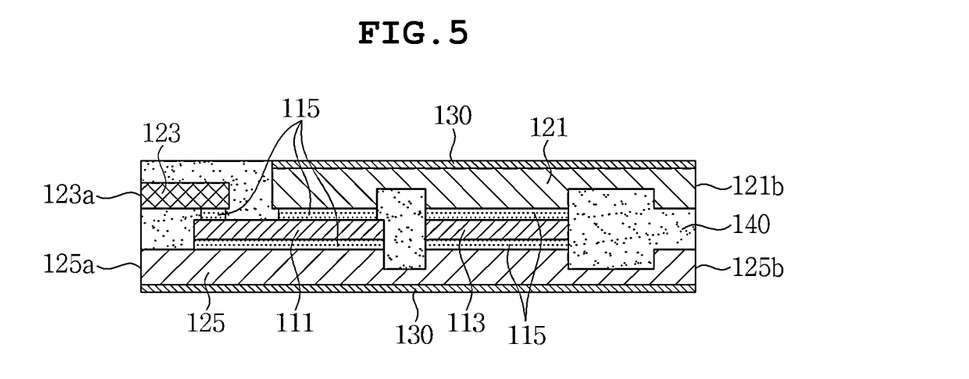
FIGS. 5 and 6 each are cross-sectional views taken along the line A1-A1' and the line B1-B1' of FIG. 3.
Figure 6:
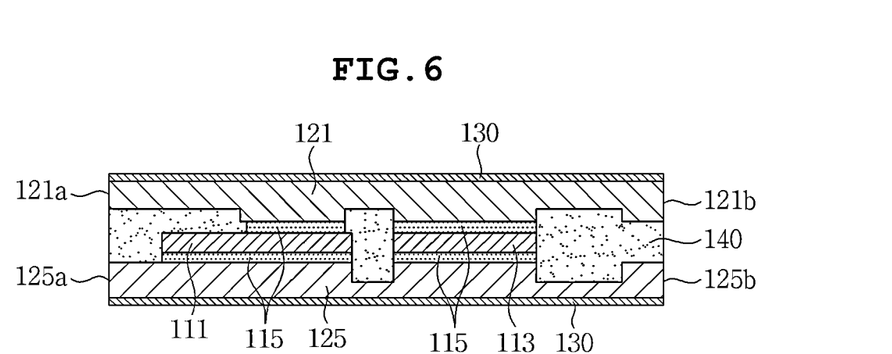

FIG. 1 is a perspective view illustrating a structure of a unit power module according to a preferred embodiment of the present invention, FIGS. 2A and 2B are plan views illustrating top and bottom surfaces of the unit power module according to the preferred embodiment of the present invention, FIGS. 3 and 4 each illustrate one side view and the other side view of the unit power module according to the preferred embodiment of the present invention, and FIGS. 5 and 6 each are cross-sectional views taken along the line A1-A1' and the line B1-B1' of FIG. 3.

Referring to FIGS. 1 to 6, a unit power module 110 according to the preferred embodiment of the present invention includes a first semiconductor chip 111, a second semiconductor chip 113, a first metal plate 121, a second metal plate 123, a third metal plate 125, and a sealing member 140.

In this configuration, the first semiconductor chip 111 and the second semiconductor chip 113 may be power devices but, the preferred embodiment of the present invention is not particularly limited thereto.

The power device may include a silicon controlled rectifier (SCR), a power transistor, an insulated gate bipolar transistor (IGBT), a MOS transistor, a power rectifier, a power regulator, an inverter, a converter, a high power semiconductor chip that is a combination thereof, a diode, and the like, but is not limited thereto.

In the preferred embodiment of the present invention, the insulated gate bipolar transistor (IGBT) is used as the first semiconductor chip 111 and the diode is used as the second semiconductor chip 113, but this is only one embodiment. The present invention is not limited thereto, but other power devices can also be used.

Hereinafter, as described above, the case in which the insulated gate bipolar transistor (IGBT) is used as the first semiconductor chip 111 and the diode is used as the second semiconductor chip 113 will be described by way of example.

The first semiconductor chip 111 has one surface and the other surface and the one surface may be provided with a 1-1-th electrode (not illustrated) and a 1-2-electrode (not illustrated) spaced apart from the 1-1-th electrode (not illustrated) and the other surface may be provided with a 1-3-th electrode (not illustrated).

Further, the second semiconductor chip 113 also has one surface and the other surface and the one surface may be provided with a 2-1-th electrode (not illustrated) and the other surface may be provided with a 2-2-th electrode (not illustrated).

Hereinafter, the 1-1-th electrode, the 1-2-th electrode, and the 1-3-th electrode of the first semiconductor chip 111 each are an emitter electrode, a gate electrode, and a collector electrode and the 2-1-th electrode and a 2-2-th electrode of the second semiconductor chip 113 each are an anode electrode and a cathode electrode.

In this case, the emitter electrode of the first semiconductor chip 111 and the anode electrode of the second semiconductor chip 113 and the collector electrode of the first semiconductor chip 111 and the cathode electrode of the second semiconductor chip 113 may each be connected with a terminal having the same polarity.

That is, the emitter electrode of the first semiconductor chip 111 and the anode electrode of the second semiconductor chip 113 and the collector electrode of the first semiconductor chip 111 and the cathode electrode of the second semiconductor chip 113 may each be connected with one pattern.

In the preferred embodiment of the present invention, the first metal plate 121, the second metal plate 123, and the third plate 125 may be formed of copper (Cu), but the preferred embodiment of the present invention is not particularly limited thereto.

In the preferred embodiment of the present invention, as illustrated in FIGS. 1, 5, and 6, the first metal plate 121 may be disposed to contact the emitter electrode of the first semiconductor chip 111 and the anode electrode of the second semiconductor chip 113, the second metal plate 123 may be disposed to contact the gate electrode of the first semiconductor chip 111, and the third metal plate 125 may be disposed to contact the collector electrode of the first semiconductor chip 111 and the cathode electrode of the second semiconductor chip 113.

That is, one surface of the first semiconductor chip 111 and the second semiconductor chip 113 is provided with the first metal plate 121 and the other surface thereof is provided with the third metal plate 125 to dispose the first semiconductor chip 111 and the second semiconductor chip 113 between the first metal plate 121 and the third metal plate 125. In this case, one surface of the first semiconductor chip 111 is provided with the second metal plate 123 so as to be spaced apart from the first metal plate 121.

In this case, the unit power module 100 according to the preferred embodiment of the present invention may further include a bonding member 115 that bonds the first metal plate 121, the second metal plate 123, and the third metal plate 125 to the first semiconductor chip 111 and the second semiconductor chip 113.

Here, the bonding member 115 may be a solder, but the preferred embodiment of the present invention is not particularly limited thereto. Therefore, any conductive bonding material can be used.

In the preferred embodiment of the present invention, the sealing member 140 may be formed to surround the first metal plate 121, the second metal plate 123, and the third metal plate 125, as illustrated in FIG. 1.

Therefore, the first semiconductor chip 111 and the second semiconductor chip 113 that are disposed between the first metal plate 121 and the third metal plate 125 may also be sealed.

In this case, as the sealing member 140, epoxy molded compound (EMC), and the like, may be used, but the preferred embodiment of the present invention is not particularly limited thereto.

Further, the unit power module 100 according to the preferred embodiment of the present invention may further include an insulating layer 130 formed on the first metal plate 121 and the third metal plate 125, but the preferred embodiment of the present invention is not particularly limited thereto.

This is to prevent the electrical short from occurring due to the surfaces of the first metal plate 121 and the third metal plate 125 that are exposed to the outside.

In this case, the insulating layer 130 may be formed of the same material as the foregoing sealing member 140, but the preferred embodiment of the present invention is not particularly limited thereto. Therefore, all materials used as an insulating material known in the art can be used.

Meanwhile, FIG. 1 illustrates that a thickness of the second metal plate 123 is smaller than that of the first metal plate 121, which is only one preferred embodiment. Therefore, the thickness of the second metal plate may be formed to be the same as that of the first metal plate. If the second metal plate and the first metal plate are formed to have the same thickness, the insulating layer 130 may also be formed on the second metal plate 132.

Further, as illustrated in FIGS. 1, 3, and 4, the unit power module 100 according to the preferred embodiment of the present invention has one side and the other side in a perpendicular direction to their thickness. Meanwhile, as illustrated in FIG. 3, the first metal plate 121, the second metal plate 123, and the third metal plate 125 are exposed to the one side and as illustrated in FIG. 4, the first metal plate 121 and the third metal plate 125 may be exposed to the other side.

Hereinafter, the first metal plate 121, the second metal plate 123, and the third metal plate 125 exposed to both sides are each named emitter pads 121*a* and 121*b*, a gate pad 123*a*, and collector pads 125*a* and 125*b*.

As such, exposing the first metal plate 121, the second metal plate 123, and the third metal plate 125 to both sides of the unit power module 100 contact a connection member 240 formed in an insertion groove 211 of a case 210 to be described below to electrically connect the first semiconductor chip 111 and the second semiconductor chip 113 within the unit power module 100 with the external connection terminal. This will be described below in detail.

In this case, the first metal plate 121, the second metal plate 123, and the third metal plate 125 that are exposed to both sides of the unit power module 100 may be formed to have the same plane as the sealing member 140 and may be formed to be protruded from the sealing member 140, but the preferred embodiment of the present invention is not particularly limited thereto.

As described above, the power device equipped in the power module package can be manufactured in the module form to test the defect of the module manufactured before being packaged and then packages only the good product, such that the power module package can be manufactured, thereby reducing the failure cost.

Further, according to the preferred embodiments of the present invention, the metal plate corresponding to the circuit patterns according to the prior art can be bonded to all the electrodes of the semiconductor chip, respectively and then modularized to remove the use of the wire as compared with the case in which the circuit patterns according to the related art are electrically connected with the semiconductor using the wire, thereby simplifying the structure and the process and shortening the process time.

Power Module Package

Figure 7:
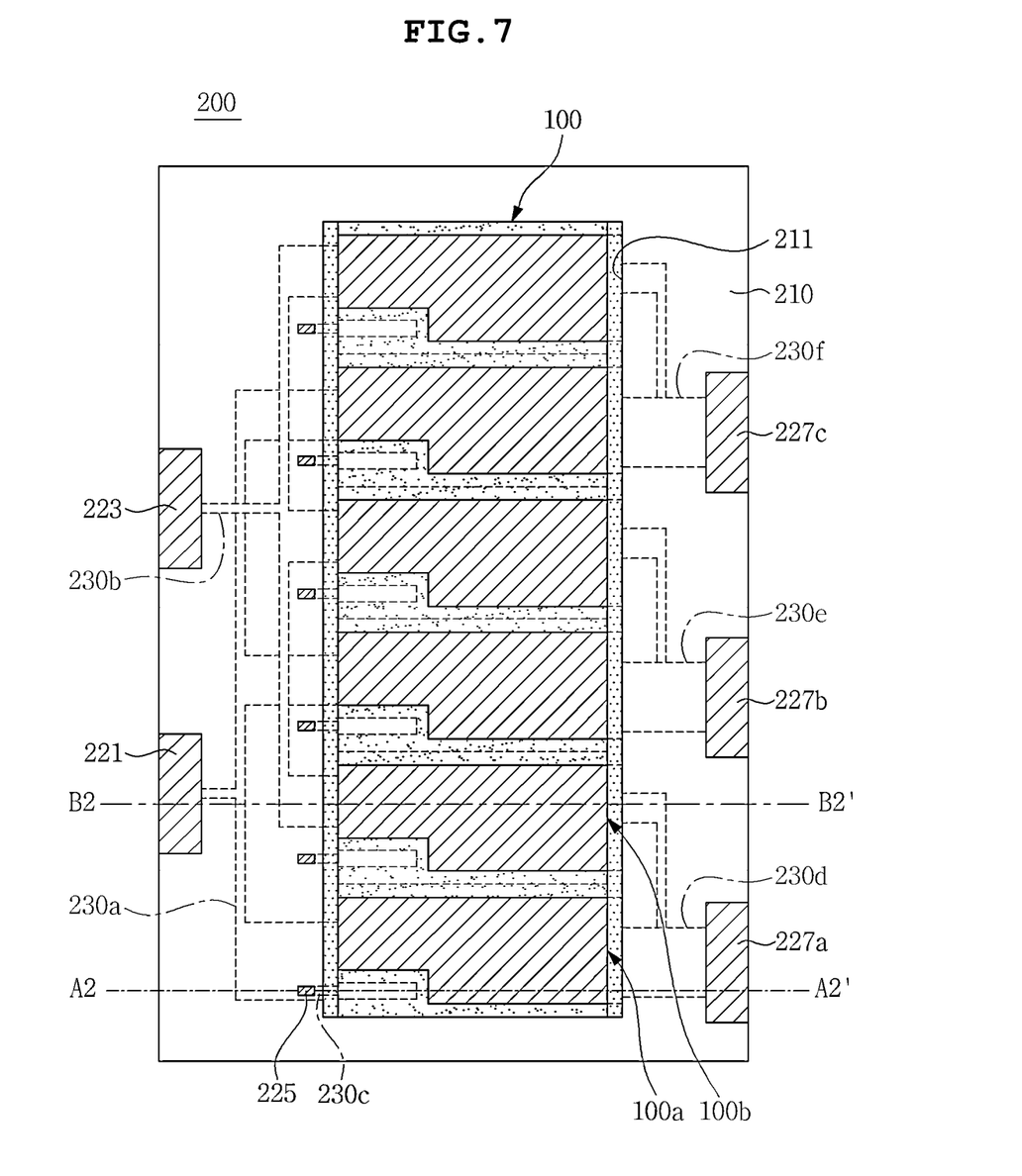
FIG. 7 is a plan view of a power module package including the unit power module according to the preferred embodiment of the present invention.
Figure 8:
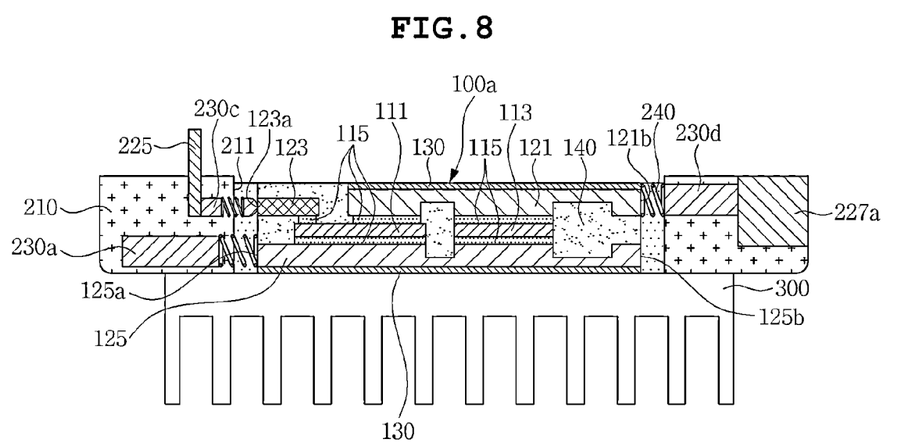
FIGS. 8 and 9 each are cross-sectional views taken along the line A2-A2' and the line B2-B2' of FIG. 7.
Figure 9:
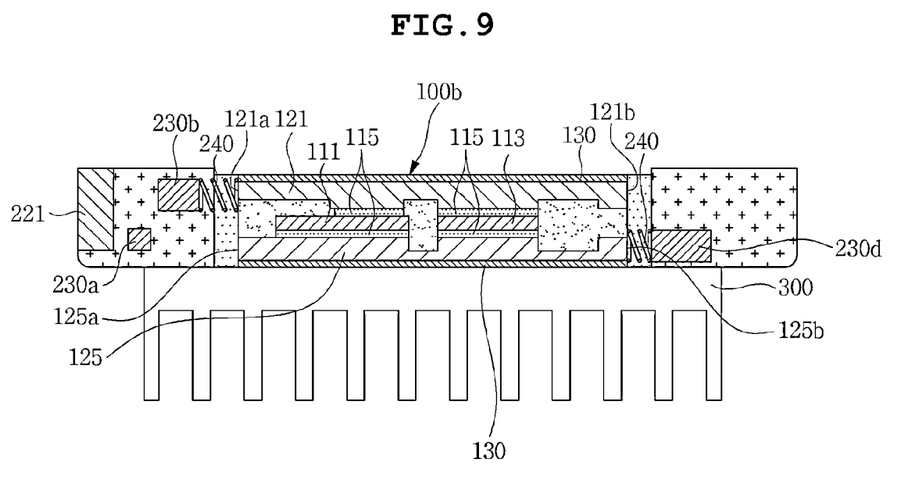
Figure 10:
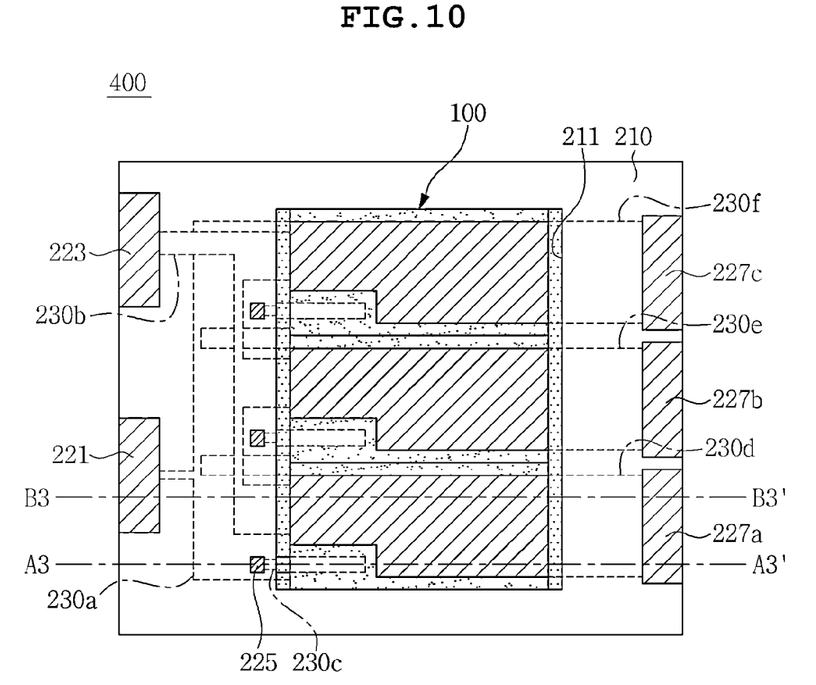
FIG. 10 is a plan view of a power module package including a unit power module according to another preferred embodiment of the present invention.
Figure 11:
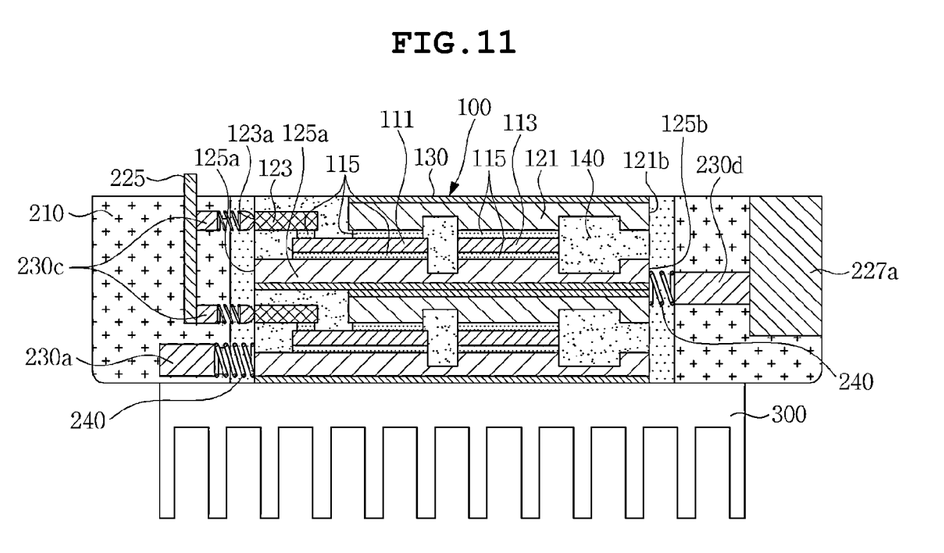
FIGS. 11 and 12 each are cross-sectional views taken along the line A3-A3' and the line B3-B3' of FIG. 10.
Figure 12:
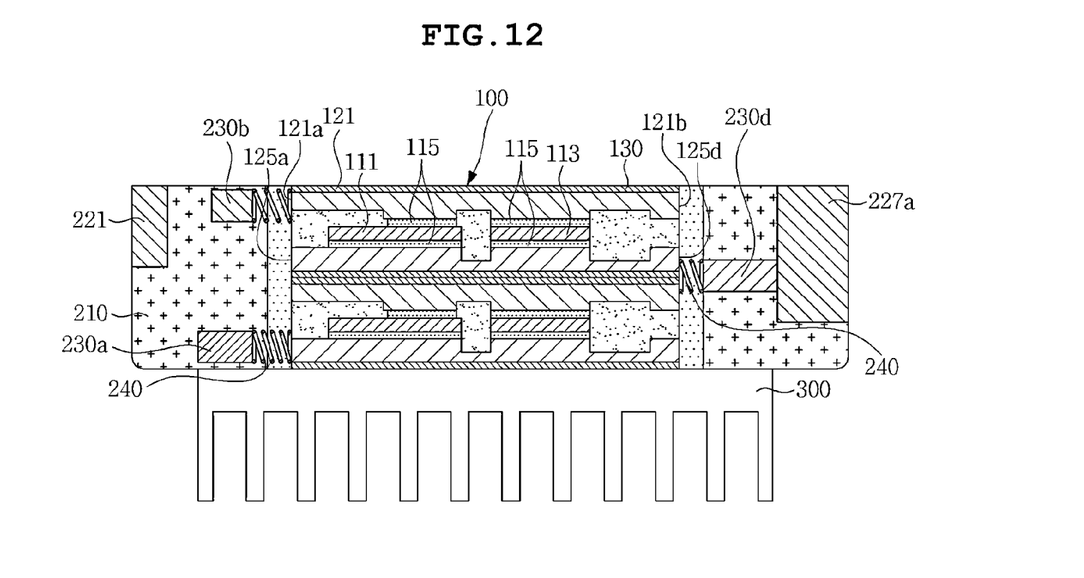

FIG. 7 is a plan view of a power module package including the unit power module according to the preferred embodiment of the present invention, FIGS. 8 and 9 each are cross-sectional views taken along the line A2-A2' and the line B2-B2' of FIG. 7, FIG. 10 is a plan view of a power module package including a unit power module according to another preferred embodiment of the present invention, and FIGS. 11 and 12 each are cross-sectional views taken along the line A3-A3' and the line B3-B3' of FIG. 10.

First, referring to FIG. 7, a power module package 200 according to a preferred embodiment of the present invention may include the unit power module 100 and the case 210 in which at least one unit power module 100 is received.

Meanwhile, the unit power module 100 is described in detail with reference to the unit power module portion and therefore, will be briefly described herein.

In the preferred embodiment of the present invention, as illustrated in FIGS. 1 to 6, the unit power module 100 includes the first semiconductor chip 111 having the emitter electrode (not illustrated) and the gate electrode (not illustrated) spaced apart from the emitter electrode formed one surface thereof and the collector electrode (not illustrated) formed on the other side thereof, the second semiconductor chip 113 having the anode electrode (not illustrated) formed on one surface thereof and the cathode electrode (not illustrated) formed on the other surface thereof, the first metal plate 121 contacting the emitter electrode (not illustrated) of the first semiconductor chip 111 and the anode electrode of the second semiconductor chip 113, the second metal plate 123 contacting the gate electrode (not illustrated) of the first semiconductor chip 111, the third metal plate 125 contacting the collector electrode (not illustrated) of the first semiconductor chip 111 and the cathode electrode (not illustrated) of the second semiconductor chip 113, and the sealing member 140 formed to surround the surfaces of the first metal plate 121, the second metal plate 123, and the third metal plate 125.

Further, the surface of the first metal plate 121 and the surface of the third metal plate 125 may be further provided with the insulating layer 130.

Further, as illustrated in FIG. 3, the first metal plate 121, the second metal plate 123, and the third metal plate 125 may be exposed to one of both sides of the unit power module 100 and as illustrated in FIG. 4, the first metal plate 121 and the third metal plate 125 may be exposed to the other side thereof.

Hereinafter, the first metal plate 121, the second metal plate 123, and the third metal plate 125 exposed to both sides are each named the emitter pads 121a and 121b, the gate pad 123a, and the collector pads 125a and 125b.

As illustrated in FIG. 7, the case 210 according to the preferred embodiment of the present invention may include the insertion groove 211 in which at least one unit power module 100 is received.

In this case, the insertion groove 211 may be formed to penetrate through the case 210 in a thickness direction, but the preferred embodiment of the present invention is not limited thereto.

Further, the external connection terminal formed to be exposed to the surface of the case 210 may be further provided. Herein, the external connection terminal may include a power supply terminal 221, a ground terminal 223, a control terminal 225, and output terminals 227a, 227b, and 227c as illustrated in FIG. 7, but the preferred embodiment of the present invention is not limited thereto.

In this case, the power supply terminal 221 is a terminal for supplying power to the first semiconductor chip 111 and the second semiconductor chip 113 within the unit power module 100, the ground terminal 223 is a terminal for connecting and grounding current flowing out from the first semiconductor chip 111 and the second semiconductor chip 113 by reference potential, the control terminal 225 is a terminal for transferring a driving signal for driving the first semiconductor chip 111 to the gate electrode, and the output terminals 227a, 227b, and 227c are terminals for transferring current output from the first semiconductor chip 111 and the second semiconductor chip 113 to the external apparatus.

Here, the reason of providing the output terminals 227a, 227b, and 227c in three is to connect with loads of each phase of an external apparatus having a 3 phase load such as a 3 phase motor, which is only the preferred embodiment of the present invention. Therefore, the present invention is not particularly limited thereto.

Hereinafter, an output terminal 227a may be called a U-phase output terminal 227a and an output terminal 227b may be called a V-phase output terminal 227b, and an output terminal 227c may be called a W-phase output terminal 227c.

Further, as described above, for connecting with the external apparatus having the 3 phase load such as the 3 phase motor, one set module for outputting each phase is required. Herein, the set module means two unit power modules 100.

Therefore, in the preferred embodiment of the present invention, as illustrated in FIG. 7, a total of 6 unit power modules 100, that is, three sets of modules are received in the case 210 and the adjacent unit power modules 100 from the unit power module 100 outermost located among the unit power modules 100 received in a row are operated as one set.

The detailed operation will be described below in detail.

Further, the case 210 according to the preferred embodiment of the present invention is formed in the case 210 and has one end and the other end and the one end contacts the external connection terminal and the other end may further include circuit patterns 230a, 230b, 230c, 230d, 230e, and 230f formed toward the inside of the insertion groove 211.

Herein, the circuit pattern 230a has one end contacting the power terminal 221, the circuit pattern 230b contacts one end contacting the ground terminal 223, the circuit pattern 230c has one end contacting the control terminal 225, and the circuit patterns 230d, 230e, and 230f may each have ends that may be connected with the U-phase output terminal 227a, the V-phase output terminal 227b, and the W-phase output terminal 227c.

In this case, the circuit pattern 230a contacting the power supply terminal 221 and the circuit pattern 230b contacting the ground terminal 223 are each connected with two unit power modules 100 included in the foregoing set module.

In detail, the third metal plate 125 of one of the two adjacent unit power modules 100 is connected with the circuit pattern 230a contacting the power supply terminal 221 and the first metal plate 121 of another unit power module 100 is connected with the circuit pattern 230b contacting the ground terminal 223.

Further, in the preferred embodiment of the present invention, the other ends of the circuit patterns 230d, 230e, and 230f of which the ends are each connected with the U-phase output terminal 227a, the V-phase output terminal 227b, and the W-phase output terminal 227c, respectively, are divided into two branches as illustrated in FIG. 7, such that one of the other ends of the circuit patterns 230d, 230e, and 230f is connected with the first metal plate 121 of one unit power module 100 among the foregoing set modules and the other one of the other ends thereof may be connected with the third metal plate 125 of the other unit power module 100.

Therefore, when power is supplied from the set module to one unit power module 100 to output current, the output current is transferred to the output terminals 227a, 227b, and 227c and is output to the outside and at the same time, is transferred to the other adjacent unit power modules 100 and flows in the ground terminal 223 and thus may be grounded.

Further, the case 210 according to the preferred embodiment of the present invention has one end and the other end and the one end contacts the circuit patterns 230a, 203b, 230c, 230d, 230e, and 230f and the other end may further include the plurality of connection members 240 that are protruded to the inside of the insertion groove 211 to contact the emitter pads 121 and 121b, the gate pad 123a, and the collector pads 125a and 125b of the unit power module 100, respectively.

Herein, the connection member 240 may be formed of materials having conductivity and elastic force. For example, as the connection member 240, a spring formed of metal, and the like, may be used, but the preferred embodiment of the present invention is not particularly limited thereto.

Therefore, the unit power module 100 may be easily detached/attached to/from the insertion groove 211 of the case 210, similar to the method of attaching and detaching, for example, a battery.

Further, as described above, according to the preferred embodiment of the present invention, the unit power module 100 received in the insertion groove 211 of the case 210 is not fixed by a separate adhesive but can be detached/attached by the connection member 240 having elastic force, such that the unit power module 100 having a defect after being received can be replaced with the unit power module 100 that is a good product, thereby easily repairing the defective products.

As described above, in order to electrically connect the unit power module 100 received in the insertion groove 211 of the case 210 with the external apparatus, the external connection terminal including the power supply terminal 221, the ground terminal 223, the control terminal 225, and the output terminals 227a, 227b, and 227c, the circuit patterns 230a, 230b, 230c, 230d, 230e, and 230f connected with the external connection terminals, and the connection member 240 connected with the circuit patterns 230a, 230b, 230c, 230d, 230e, and 230f are formed.

Therefore, according to the preferred embodiment of the present invention, only when the only the unit power module 100 is received in the case 210, the unit power module 100 may perform the same function as the power module package in which the semiconductor chip is mounted on the substrate according to the related art and the external connection terminal is wire-bonded with the semiconductor chip and then is covered with the case.

In detail, a driving principle of the power module package 200 according to the preferred embodiment of the present invention will be described below.

Referring to FIG. 8, when power is supplied from the outside through the power supply terminal 221 of one unit power module 100a in the set module, current is collected in the third metal plate 125 through the circuit pattern 230a connected with the power supply terminal 221, the connection member 240, and the collector pad 125a.

Next, when the driving signal is input through the control terminal 225 of the unit power module 100a from the outside, the signal is transferred to the gate electrode through the circuit pattern 230c, the connection member 240, and the gate pad 123a to drive the first semiconductor chip 111.

Therefore, the current collected in the third metal plate 125 flows in the first metal plate 121 through the first semiconductor chip 111 and the second semiconductor chip 113 and the current flowing in the first metal plate 121 is output to the external apparatus through the emitter pad 121b, the connection member 240, the circuit pattern 230d, and the U-phase output terminal 227a.

At the same time, referring to FIG. 9, current is transferred to the third metal plate 125 of the adjacent unit power modules 100 through the circuit pattern 230d, the connection member 240, and the collector pad 125b of another unit power module 100b and the transferred current is collected in the third metal plate 125.

Next, when the driving signal is input through the control terminal 225 of the unit power module 100b from the outside, the signal is transferred to the gate electrode through the circuit pattern 230c, the connection member 240, and the gate pad 123a to drive the first semiconductor chip 111.

Therefore, the current collected in the third metal plate 125 flows in the first metal plate 121 through the first semiconductor chip 111 and the second semiconductor chip 113 and the current flowing in the first metal plate 121 is output to the ground terminal 223 through the emitter pad 121a, the connection member 240, and the circuit pattern 230b.

That is, current flows in a path indicated by an arrow illustrated in FIG. 7 and other two set modules may also be operated in the same principle as the foregoing principle.

Further, in the power module package 100 according to the preferred embodiment of the present invention, a gap may be formed between the inner wall of the insertion groove 211 of the case 210 and the received unit power module 100 as illustrated in FIG. 7. This is due to the connection member 240 formed to be protruded to the inside of the insertion groove 211 and the formed gap is filled with an insulating material to improve electrical reliability.

Further, as illustrated in FIG. 8, the power module package 100 according to the preferred embodiment of the present invention may be provided with a heat sink 300 contacting a top portion or a bottom portion of the case 210.

FIG. 8 illustrates that the heat sink 300 contacts the bottom portion of the case 210, but the preferred embodiment of the present invention is not particularly limited thereto. Therefore, the heat sink may contact the top portion of the case 210 and may contact both of the top and bottom portions thereof.

Herein, the heat sink 300 is to diffuse heat generated from the first semiconductor chip 111 and the second semiconductor chip 113 in the air, but the preferred embodiment of the present invention is not particularly limited thereto. Therefore, the heat sink 300 may be formed of materials such as copper (Cu) or tin (Sn).

FIGS. 10 to 12 illustrate a structure of a power module package 400 according to a preferred embodiment of the present invention in which the unit power module 100 is not received in the power module package 200 of FIG. 7 in a single layer but is received so as to be laminated therein.

That is, in the power module package 400 according to the preferred embodiment of the present invention, as illustrated in FIGS. 11 and 12, the two unit power modules 100 that are a set module are laminated in two layers and received.

Therefore, the package size may be reduced half, as compared with the power module package 200 according to the foregoing preferred embodiment of the present invention.

The operation of the power module package 400 is the same as the power module package 200 according to the foregoing preferred embodiment of the present invention and therefore, the detailed description thereof will be omitted.

According to the preferred embodiments of the present invention, the power device equipped in the power module package can be manufactured in the unit module to test the non-defect/defect of the unit module manufactured before being packaged and then packages only the good product, such that the power module package can be manufactured, thereby reducing the failure cost.

Further, according to the preferred embodiments of the present invention, the metal plate corresponding to the circuit patterns according to the prior art can be bonded to all the electrodes of the semiconductor chip, respectively and then modularized to remove the wire bonding process as compared with the case in which the circuit patterns according to the related art are electrically connected with the semiconductor chip using the wire, thereby simplifying the process and shortening the process time.

In addition, according to the preferred embodiments of the present invention, the connection member having elastic force is protruded to the inner wall of the insertion groove of the case in which the unit power module is received to implement the detachment and attachment of the unit power module, such that only the defective unit power module can be replaced, thereby implementing the easy repairs at the time of the defect of products.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A unit power module, comprising:
   a first semiconductor chip having one surface on which a 1-1-th electrode and a 1-2-th electrode spaced apart from the 1-1-th electrode are formed and another surface on which a 1-3-th electrode is formed;
   a second semiconductor chip having one surface on which a 2-1-th electrode is formed and another surface on which a 2-2-th electrode is formed;
   a first metal plate extending in a plane generally parallel to said one surface of the first semiconductor chip and said one surface of the second semiconductor chip and contacting the 1-1-th electrode of the first semiconductor chip and the 2-1-th electrode of the second semiconductor chip, wherein the first metal plate has at least one pair of parallel, opposing lateral sides;
   a second metal plate contacting the 1-2-th electrode of the first semiconductor chip and spaced apart from the first metal plate, wherein the second metal plate has at least one pair of parallel, opposing lateral sides;
   a third metal plate extending in a plane generally parallel to said another surface of the first semiconductor chip and said another surface of the second semiconductor chip and contacting the 1-3-th electrode of the first semiconductor chip and the 2-2-th electrode of the second semiconductor chip, wherein the third metal plate has at least one pair of parallel, opposing lateral sides;
   a sealing member formed to surround the first metal plate, the second metal plate, and the third metal plate, wherein the sealing member has at least one pair of parallel, opposing lateral sides, and wherein one of the pair of parallel, opposing lateral sides of the sealing member is coincident with the other of the pair of parallel, opposing lateral sides of each of the first and third metal plates, the coincident lateral sides of the sealing member, first and third metal plates forming a second planar face of the power module opposing the first planar face of the power module, and
   wherein a thickness of the second metal plate is smaller than a thickness of the first metal plate.

2. The unit power module as set forth in claim 1, wherein the first semiconductor chip is an insulated gate bipolar transistor (IGBT) and the 1-1-th electrode, the 1-2-th electrode, and the 1-3-th electrode each are an emitter electrode, a gate electrode, and a collector electrode.

3. The unit power module as set forth in claim 1, wherein the second semiconductor chip is a diode and the 2-1-th electrode and the 2-2-th electrode each are an anode electrode and a cathode electrode.

4. The unit power module as set forth in claim 1, further comprising:
   an insulating layer formed on the third metal plate.

5. The unit power module as set forth in claim 3, wherein the first metal plate, the second metal plate, and the third metal plate exposed to both sides of the unit power module each are an emitter pad, a gate pad, and a collector pad.

6. The unit power module as set forth in claim 1, further comprising:
   an insulating layer formed on the first metal plate.

7. A power module package, comprising:
   a unit power module including a first semiconductor chip having one surface on which a 1-1-th electrode and a 1-2-th electrode spaced apart from the 1-1-th electrode are formed and another surface on which a 1-3-th electrode is formed, a second semiconductor chip having one surface on which a 2-1-th electrode is formed and another surface on which a 2-2-th electrode is formed, a first metal plate extending in a plane generally parallel to said one surface of the first semiconductor chip and said one surface of the second semiconductor chip and contacting the 1-1-th electrode of the first semiconductor chip and the 2-1-th electrode of the second semiconductor chip, wherein the first metal plate has at least one pair of parallel, opposing lateral sides, a second metal plate contacting the 1-2-th electrode of the first semiconductor chip and spaced apart from the first metal plate, wherein the second metal plate has at least one pair of parallel, opposing lateral sides, a third metal plate extending in a plane generally parallel to said another surface of the first semiconductor chip and said another surface of the second semiconductor chip and contacting the 1-3-th electrode of the first semiconductor chip and the 2-2-th electrode of the second semiconductor chip, wherein the third metal plate has at least one pair of parallel, opposing lateral sides, and a sealing member formed to surround the first metal plate, the second metal plate, and the third metal plate, wherein the sealing member has at least one pair of parallel, opposing lateral sides, and wherein one of the pair of parallel, opposing lateral sides of the sealing member is coincident with the other of the pair of parallel, opposing lateral sides of each of the first and third metal plates, the coincident lateral sides of the sealing member, first and third metal plates forming a second planar face of the power module opposing the first planar face of the power module; and
   a case in which at least one unit power module is received, wherein the first metal plate, the second metal plate, and the third metal plate are an emitter pad, a gate pad, and a collector pad, respectively, and
   wherein a thickness of the second metal plate is smaller than a thickness of the first metal plate.

8. The power module package as set forth in claim 7, wherein a plurality of unit power modules are laminated and received in the case.

9. The power module package as set forth in claim 7, wherein the first semiconductor chip is an insulated gate bipolar transistor (IGBT) and the 1-1-th electrode, the 1-2-th electrode, and the 1-3-th electrode each are an emitter electrode, a gate electrode, and a collector electrode.

10. The power module package as set forth in claim 7, wherein the second semiconductor chip is a diode and the 2-1-th electrode and the 2-2-th electrode each are an anode electrode and a cathode electrode.

11. The power module package as set forth in claim 7, further comprising:
   a heat sink contacting a top portion, a bottom portion or the top and bottom portions of the case.

12. A power module package, comprising:
   a unit power module including a first semiconductor chip having one surface on which a 1-1-th electrode and a 1-2-th electrode spaced apart from the 1-1-th electrode are formed and another surface on which a 1-3-th electrode is formed, a second semiconductor chip having one surface on which a 2-1-th electrode is formed and another surface on which a 2-2-th electrode is formed, a first metal plate extending in a plane generally parallel to said one surface of the first semiconductor chip and said one surface of the second semiconductor chip and contacting the 1-1-th electrode of the first semiconductor chip and the 2-1-th electrode of the second semiconductor chip, wherein the first metal plate has at least one pair of parallel, opposing lateral sides, a second metal plate contacting the 1-2-th electrode of the first semiconductor chip and spaced apart from the first metal plate, wherein the second metal plate has at least one pair of parallel, opposing lateral sides, a third metal plate extending in a plane generally parallel to said another surface of the first semiconductor chip and said another surface of the second semiconductor chip and contacting the 1-3-th electrode of the first semiconductor chip and the 2-2-th electrode of the second semiconductor chip, wherein the third metal plate has at least one pair of parallel, opposing lateral sides, and a sealing member formed to surround the first metal plate, the second metal plate, and the third metal plate, wherein the sealing member has at least one pair of parallel, opposing lateral sides, and wherein one of the pair of parallel, opposing lateral sides of the sealing member is coincident with the other of the pair of parallel, opposing lateral sides of each of the first and third metal plates, the coincident lateral sides of the sealing member, first and third metal plates forming a second planar face of the power module opposing the first planar face of the power module; and a case in which at least one unit power module is received, wherein the first metal plate, the second metal plate, and the third metal plate each are an emitter pad, a gate pad, and a collector pad, respectively, and wherein the case includes:
    an insertion groove into which the unit power module is inserted;
    an external connection terminal including a power supply terminal, a ground terminal, a control terminal, and an output terminal formed to be exposed on a surface of the case;
    a circuit pattern formed in an inside of the case and having one end and the other end, the one end contacting the external connection terminal and the other end being formed toward an inner wall of the insertion groove; and
    a plurality of connection members having one ends and the other ends, the one ends contacting the circuit pattern and the other end is protruded to an inside of the insertion groove to contact an emitter pad, a gate pad, and a collector pad of the unit power module, respectively.

13. The power module package as set forth in claim 12, wherein the emitter pad, the gate pad, and the collector pad exposed to one side of the unit power module each are electrically connected with a ground terminal, a control terminal, and a power supply terminal; and     the emitter pad and the collector pad exposed to the another side of the unit power module are electrically connected with the output terminal.

14. The power module package as set forth in claim 12, wherein the connection member is formed of a material having elastic force.

* * * * *